United States Patent
Tsai et al.

(10) Patent No.: US 8,048,810 B2
(45) Date of Patent: Nov. 1, 2011

(54) METHOD FOR METAL GATE N/P PATTERNING

(75) Inventors: Fang Wen Tsai, Hsinchu (TW); Jim Cy Huang, Bao-Shan Township, Hsin-Chu County (TW); Shun Wu Lin, Taichung (TW); Li-Shiun Chen, Hsin-Chu (TW); Kuang-Yuan Hsu, Fongyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/696,252

(22) Filed: Jan. 29, 2010

(65) Prior Publication Data
US 2011/0189847 A1    Aug. 4, 2011

(51) Int. Cl.
*H01L 2/311* (2006.01)
(52) U.S. Cl. ........ 438/703; 438/587; 438/585; 438/199; 257/E21.218; 257/E21.231
(58) Field of Classification Search ................ 438/703, 438/587, 585, 199; 257/E21.218, E21.231, 257/E21.632, E21.631, E21.258
See application file for complete search history.

(56) References Cited

U.S. PATENT DOCUMENTS

| | | | |
|---|---|---|---|
| 6,995,095 B2 | 2/2006 | Yu | |
| 7,138,323 B2 | 11/2006 | Kavalieros et al. | |
| 7,611,943 B2 | 11/2009 | Liu | |
| 2005/0191852 A1* | 9/2005 | Takigawa et al. | 438/637 |
| 2008/0206578 A1* | 8/2008 | Rantala et al. | 428/447 |
| 2009/0075441 A1 | 3/2009 | Chou et al. | |
| 2009/0291561 A1* | 11/2009 | Koh et al. | 438/703 |
| 2010/0059833 A1* | 3/2010 | Yu et al. | 257/410 |
| 2010/0068884 A1* | 3/2010 | Chen et al. | 438/694 |
| 2010/0087038 A1* | 4/2010 | Chung et al. | 438/199 |
| 2010/0087055 A1* | 4/2010 | Lai et al. | 438/585 |
| 2010/0087056 A1* | 4/2010 | Chung et al. | 438/585 |
| 2010/0112798 A1* | 5/2010 | Lai et al. | 438/591 |
| 2010/0240204 A1* | 9/2010 | Yeh et al. | 438/585 |
| 2010/0311231 A1* | 12/2010 | Thei et al. | 438/587 |
| 2011/0006354 A1* | 1/2011 | Jangjian et al. | 257/314 |

* cited by examiner

*Primary Examiner* — Walter L Lindsay, Jr.
(74) *Attorney, Agent, or Firm* — Haynes and Boone, LLP

(57) ABSTRACT

A method for fabricating a integrated circuit is disclosed. An exemplary method includes providing a substrate; forming a hard mask layer over the substrate; forming a patterned photoresist layer over the hard mask layer, such that portions of the hard mask layer are exposed; performing a dry etching process to remove the exposed portions of the hard mask layer; removing the patterned photoresist layer using at least one of a nitrogen plasma ashing and a hydrogen plasma ashing; and performing a wet etching process to remove remaining portions of the hard mask layer.

20 Claims, 14 Drawing Sheets

METHOD FOR METAL GATE N/P PATTERNING

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down has also lead to high-k dielectric layers and conductive (e.g., metal) layers being adopted to form gate stacks in various IC devices, such as metal-oxide-semiconductor field-effect-transistors (MOSFETs). The conductive layers are often tuned to have a proper work function to achieve a designed threshold voltage for n-type and p-type devices. Typically, the conductive layers are patterned using a combination of etching processes, for example, dry and wet etching processes. It has been observed that dry etching processes can result in damage to the high-k dielectric and conductive layers; and wet etching processes can result in lateral etching and/or low etching selectivity, degrading patterning profiles. Accordingly, what is needed is an improved method for making an IC device.

SUMMARY

The present disclosure provides for many different embodiments. An exemplary method includes providing a substrate; forming a hard mask layer over the substrate; forming a patterned photoresist layer over the hard mask layer, such that portions of the hard mask layer are exposed; performing a dry etching process to remove the exposed portions of the hard mask layer; removing the patterned photoresist layer using at least one of a nitrogen plasma ashing and a hydrogen plasma ashing; and performing a wet etching process to remove remaining portions of the hard mask layer.

Yet another exemplary method includes providing a substrate having a first region that includes a gate structure and a second region that includes a gate structure, wherein a high-k dielectric layer and a first conductive layer partially fill in openings of the gate structures; forming a hard mask layer including a siloxane polymer base over the substrate, wherein the hard mask layer fills the remainder of the openings in the gate structures; and forming a patterned photoresist layer over the hard mask layer, such that the hard mask layer in the first region is exposed. The method can further include performing a dry etching process to remove the exposed hard mask layer in the first region; performing an ashing process to remove the patterned photoresist layer; performing a wet etching process to remove the first conductive layer from the gate structure in the first region; and performing another wet etching process to remove the hard mask layer in the second region.

Yet another exemplary method includes providing a substrate with a first region and a second region; forming a first gate structure in the first region and a second gate structure in the second region, the first and second gate structures include a dummy gate; and removing the dummy gate from the first and second gate structures, thereby forming an opening in the first and second gate structures. A high-k dielectric layer, a capping layer, and a first conductive layer can be formed to partially fill in the opening of the first and second gate structures. The method can further include forming a hard mask layer including a siloxane polymer over the substrate, to fill the remainder of the opening of the first and second gate structures; and forming a patterned photoresist layer over the hard mask layer, such that the patterned photoresist layer exposes the hard mask layer in the first region. The hard mask layer can be removed in the various regions. For example, the method can include performing a dry etching process to remove the hard mask layer in the first region, including removing the hard mask layer from the first gate structure to form another opening in the first gate structure, such that the first conductive layer is exposed; performing an ashing process that utilizes a nitrogen plasma, a hydrogen plasma, or combination thereof to remove the patterned photoresist layer; performing a wet etching process to remove the exposed first conductive layer in the another opening of the first gate structure; performing another wet etching process to remove the hard mask layer in the second region. A second conductive layer can be formed to partially fill in the another opening of the first gate structure in the first region.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
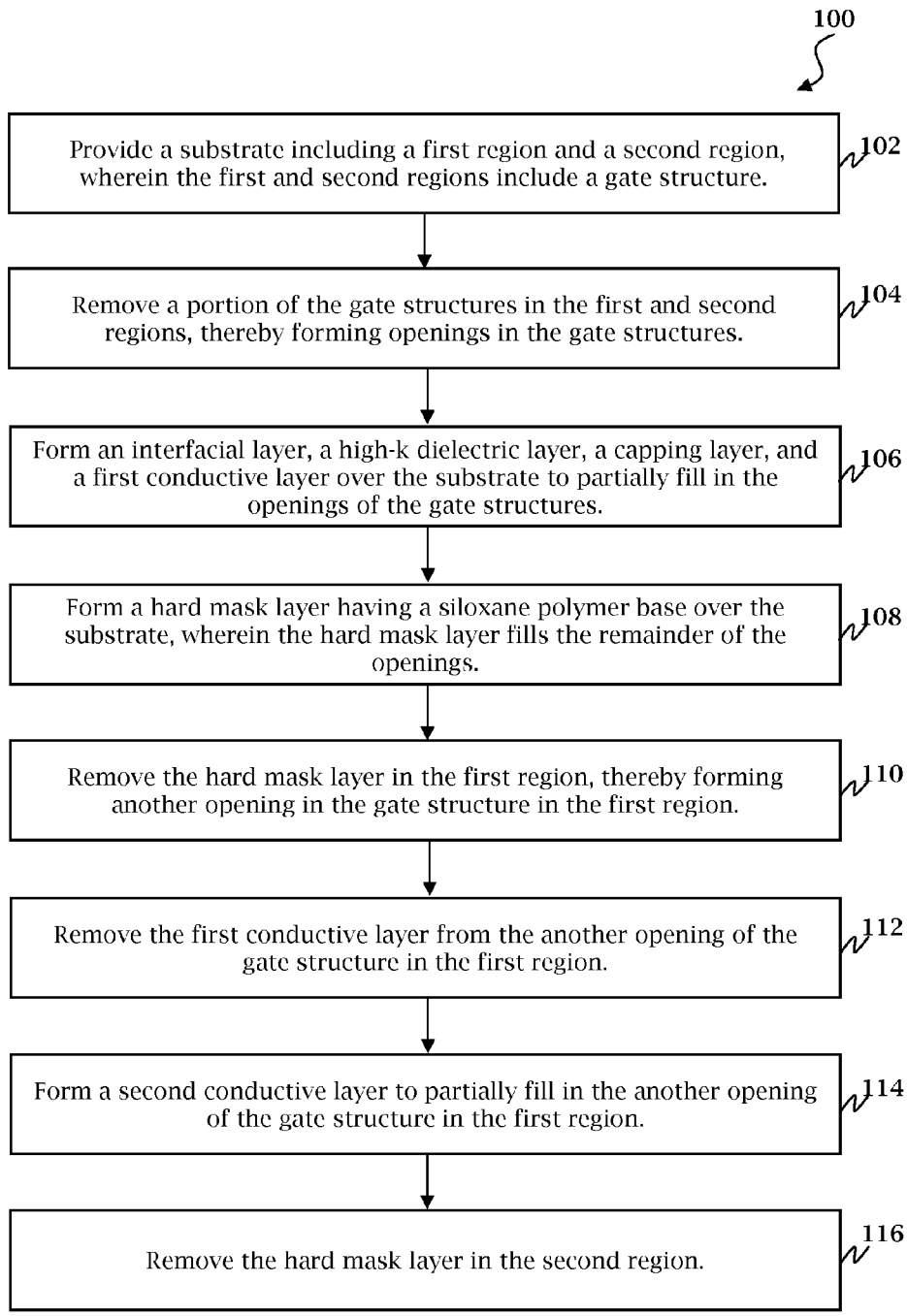
FIG. 1 is a flow chart of a method for fabricating an integrated circuit device according to aspects of the present invention.

The present disclosure relates generally to methods for manufacturing integrated circuit devices, and more particularly, to gate patterning methods.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2A-2M, a method 100 and a semiconductor device 200 are collectively described below. The semiconductor device 200 illustrates an integrated circuit, or portion thereof, that can comprise memory cells and/or logic circuits. The semiconductor device 200 can include passive components, such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. It is understood that additional steps can be provided before, during, and after the method 100, and some of the steps described below can be replaced or eliminated for additional embodiments of the method. It is further understood that additional features can be added in the semiconductor device 200, and some of the features described below can be replaced or eliminated for additional embodiments of the semiconductor device 200.

FIG. 1 is a flow chart of one embodiment of the method 100 for fabricating the semiconductor device 200 in a "gate last" process. FIGS. 2A-2M are various cross-sectional views of the semiconductor device 200 according to one embodiment, in portion or entirety, during various fabrication stages of the method 100. Alternatively, the semiconductor device 200 may be fabricated in a gate first process or hybrid process including a gate first process and a gate last process. In the gate last process, a dummy poly gate structure is formed first and then the dummy poly gate structure is removed and replaced with a metal gate structure. In the gate first process, a metal gate structure is formed first and is followed by a CMOS process flow to fabricate the final device. In the hybrid gate process, a metal gate structure of one type of device is formed first and a metal gate structure of another type of device is formed last. Further, the gate last process, gate first process, or hybrid process can form a gate structure including polysilicon. The semiconductor device 200 is formed by CMOS technology processing, and thus some processes are not described in detail herein.

Figure 2A:
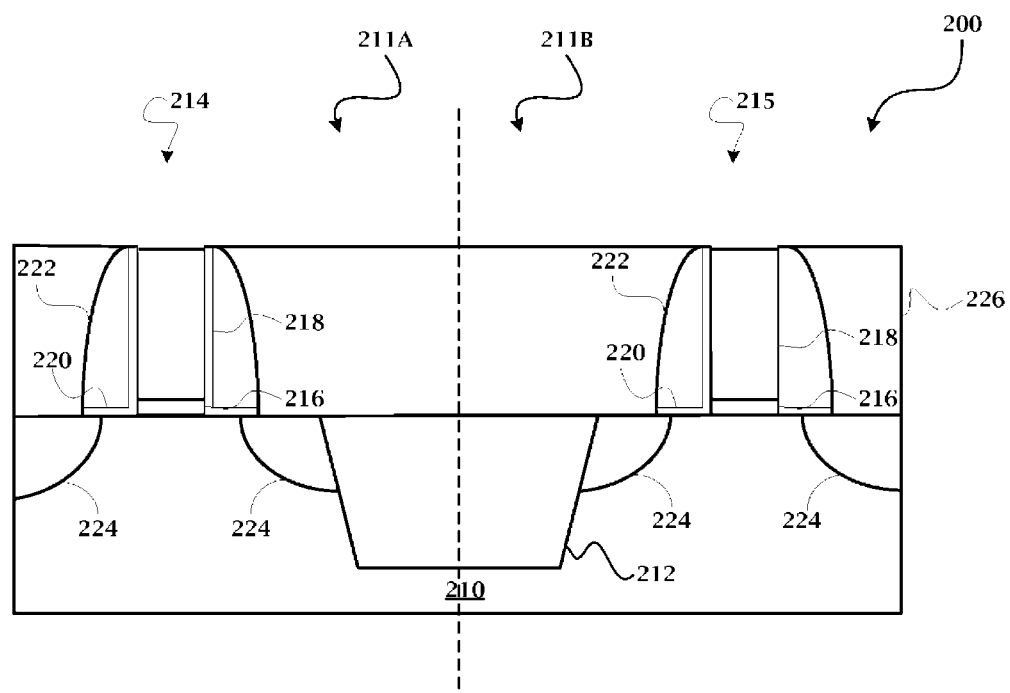
FIGS. 2A-2M are various cross-sectional views of embodiments of the integrated circuit device during various fabrication stages according to the method of FIG. 1.

Referring to FIGS. 1 and 2A, at block 102 of the method 100, a substrate 210 is provided. In the present example, the substrate 210 is a semiconductor substrate including silicon. Alternatively, the substrate 210 comprises an elementary semiconductor including germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure.

The substrate 210 includes various doping configurations depending on design requirements as known in the art (e.g., p-type substrate regions or n-type substrate regions). For example, the substrate 210 includes various regions doped with p-type dopants, such as boron or $BF_2$; n-type dopants, such as phosphorus or arsenic; and/or combinations thereof. The doped regions are formed directly on the substrate 210, in a P-well structure, in a N-well structure, in a dual-well structure, and/or using a raised structure. In the present example, the substrate 210 includes a first region 211A and a second region 211B. The first region 211A is configured for an NMOS device, and the second region 211B is configured for a PMOS device. Alternatively, the first and second regions 211A, 211B could be configured differently, such as the first region 211A being configured for a PMOS device, and the second region 211B being configured for an NMOS device.

At least one isolation region 212 is formed on the substrate 210 to isolate various regions (e.g., first and second regions 211A, 211B) of the substrate 210, and in the present example, to isolate the NMOS and PMOS device regions. The isolation region 212 utilizes isolation technology, such as LOCOS or STI, to define and electrically isolate the various first and second regions 211A, 211B. The isolation region 212 includes silicon oxide, silicon nitride, silicon oxynitride, other suitable materials, and/or combinations thereof. The isolation region 212 is formed by any suitable process. As one example, the formation of the STI includes a photolithography process, etching a trench in the substrate (for example, by using a dry etching and/or wet etching), and filling the trench (for example, by using a chemical vapor deposition process) with one or more dielectric materials. In some examples, the filled trench may have a multi-layer structure such as a thermal oxide liner layer filled with silicon nitride or silicon oxide.

One or more gate structures are formed over the substrate 210—in the present embodiment, a first gate structure 214 is formed over the substrate 210 in the first/NMOS region 211A and a second gate structure 215 is formed over the substrate 210 in the second/PMOS region 211B. The gate structures 214, 215 include gate stacks having a dummy gate dielectric layer 216 and a dummy gate layer 218; gate spacer liner 220; and gate spacers 222. The gate structures are formed by deposition, photolithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods, such as maskless photolithography, electron-beam writing, or ion-beam writing. The etching processes include dry etching, wet etching, and/or other etching methods. It is understood that the gate structures may be formed simultaneously, utilizing the same processing steps and processing materials; independently of one another, utilizing varying processing steps and processing materials; or using a combination of simultaneous and independent processing steps and processing materials.

The gate stack including the dummy gate dielectric layer 216 and dummy gate layer 218 is formed by a suitable process. For example, the dummy gate dielectric layer 216 and dummy gate layer 218 are deposited over the substrate 210. Then, a photoresist layer is formed over the dummy gate layer 218 by a suitable process, such as spin-on coating, and patterned to form a patterned photoresist feature. The pattern of the photoresist can then be transferred by a dry etching process to the underlying layers (i.e., the dummy gate dielectric layer 216 and dummy gate layer 218) to form the gate stacks including dummy gate dielectric layer 216 and dummy gate layer 218 as shown in FIG. 2A. The photoresist layer may be stripped thereafter. The gate stack of the gate structures 214, 215 can include additional layers, including interfacial layers, high-k dielectric layers, capping layers, diffusion/barrier layers, conductive layers, other suitable layers, and/or combinations thereof.

In the present example, the dummy gate dielectric layer 216 (also referred to as a dummy gate oxide layer or an interfacial layer) includes an oxide material, such as silicon oxide, and the dummy gate layer 218 includes polysilicon. Alternatively, the dummy gate dielectric layer 216 could include silicon oxynitride (SiON). Other materials are contemplated for the dummy gate dielectric and dummy gate layers 216 and 218, and each layer could include multiple material layers.

The spacer liner 220 includes an oxide material (e.g., silicon oxide). The gate spacers 222, which are positioned on each side of the gate stacks, include a dielectric material, such as silicon nitride, silicon oxide, silicon oxynitride, other suitable materials, and/or combinations thereof. The gate spacers 222 can be used to offset subsequently formed doped regions, such as heavily doped source/drain regions.

Various doped regions 224 are formed in the substrate 210. The various doped regions 224 can include lightly doped source/drain (LDD) regions and/or source/drain (S/D) regions (also referred to as heavily doped S/D regions). The LDD regions and S/D regions are formed by ion implantation processes, photolithography processes, diffusion processes, and/or other suitable processes. The doping species depend on the type of device being fabricated, such as an NMOS or PMOS device, and include p-type dopants, such as boron or $BF_2$; n-type dopants, such as phosphorus or arsenic; and/or combinations thereof. The LDD and S/D regions could comprise various doping profiles. Annealing processes can be performed to activate the LDD and/or S/D regions and could include rapid thermal annealing (RTA) and/or laser annealing processes. In some examples, the S/D regions include raised S/D regions, which could be formed by epitaxy processes. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy processes may use gaseous and/or liquid precursors, which interact with the composition of the substrate 210 (e.g., silicon). Further, in some examples, contact features, such as silicide regions, may be formed and coupled to the doped regions 224.

A dielectric layer 226, such as an interlayer (or inter-level) dielectric (ILD) layer, is formed over the substrate 210. The ILD layer 226 includes a dielectric material, such as silicon oxide, silicon nitride, silicon oxynitride, low-k dielectric material, other suitable dielectric materials, and/or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, and/or combinations thereof. The ILD layer 226 could include a multi-layer structure having multiple dielectric materials, and additional layers could be formed overlying and/or underlying the ILD layer 226. A chemical mechanical polishing (CMP) process of the ILD layer 226 is performed until the dummy gate layer 218 of gate structures 214, 215 is exposed as illustrated in FIG. 2A.

Figure 2B:
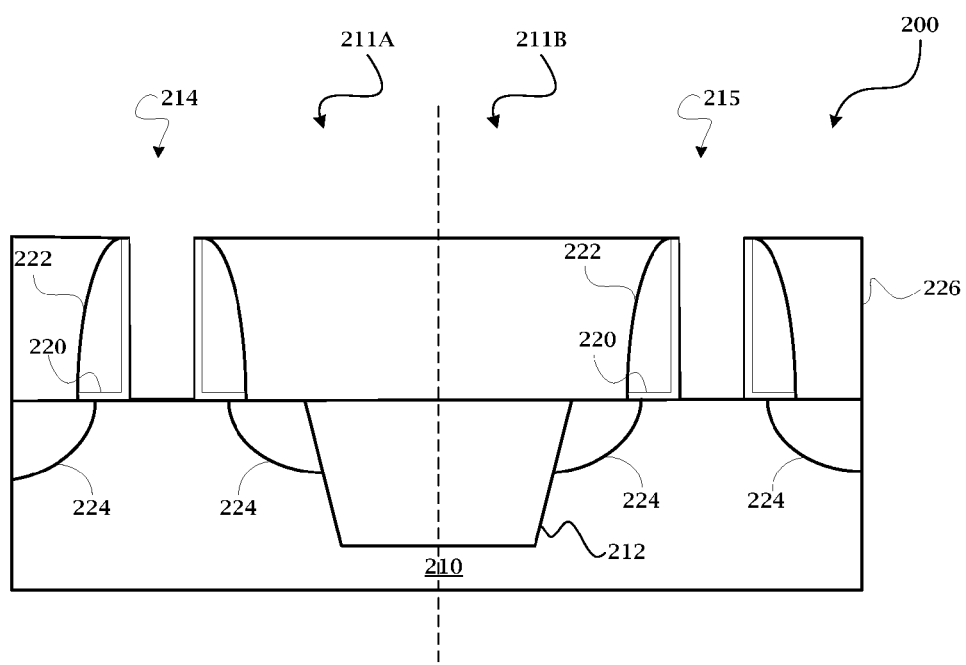

Referring to FIGS. 1 and 2B, at step 104, a portion of the gate structures 214, 215 is removed, thereby forming openings in the gate structures 214, 215. More specifically, the dummy gate layer 218 and the dummy gate dielectric layer 216 of gate structures 214, 215 are removed (simultaneously or independently) to form an opening (trench) in the gate structures 214, 215. In the present example, removing the portions of the gate structures 214, 215 is accomplished by wet etching processes, dry etching processes, or combinations thereof.

Figure 2C:
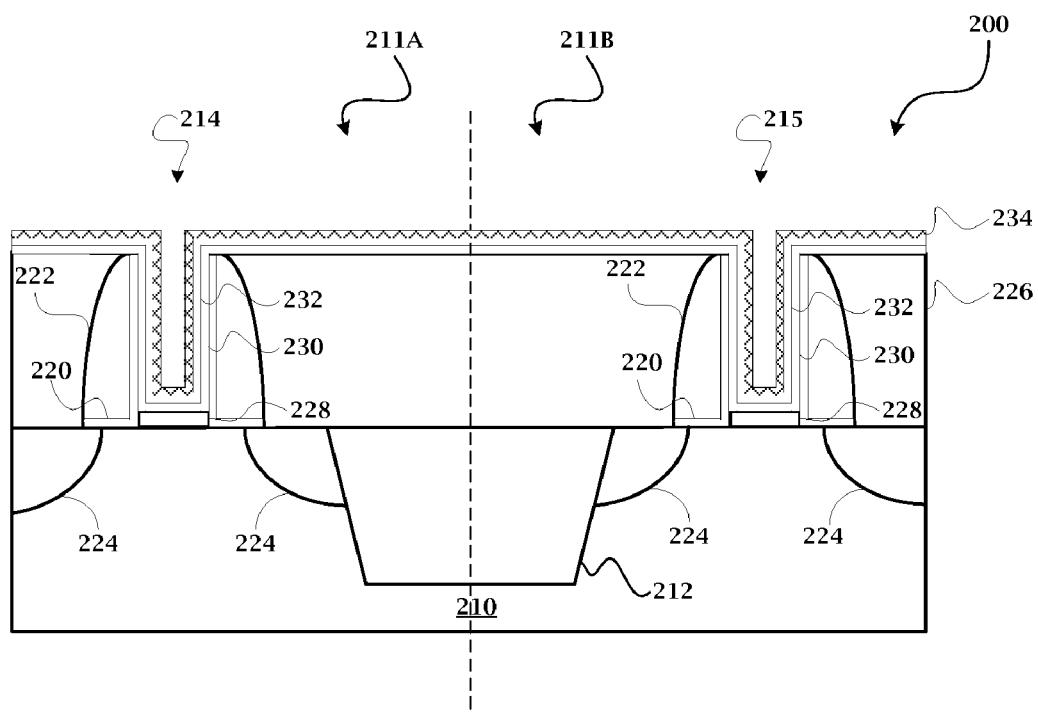

Referring to FIGS. 1 and 2C, at block 106, an interfacial layer 228, a high-k dielectric layer 230, a capping layer 232, and a first conductive layer 234 are formed over the substrate 210 and/or within the openings of the gate structures 214, 215. Particularly, the interfacial layer 228, high-k dielectric layer 230, capping layer 232, and first conductive layer 234 partially fill the openings of the gate structures 214, 215.

The interfacial layer 228 includes an oxide material. For example, the interfacial layer 228 includes a silicon oxide layer (e.g., thermal oxide or chemical oxide) having a thickness from about 5 angstroms (Å) to about 20 Å. Alternatively, the interfacial layer 228 includes silicon oxynitride (SiON). In some examples, the dummy gate dielectric layer 216 may not be removed from the gate structures 214, 215 as discussed above, and thus, the dummy gate dielectric layer 216 would act as the interfacial layer, eliminating the need to form the interfacial layer 228.

The high-k dielectric layer 230 includes a high-k dielectric material, such as $HfO_2$, HfSiO, HfSiON, HfTaO, HfTiO, HfZrO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, $(Ba, Sr)TiO_3$ (BST), $Al_2O_3$, $Si_3N_4$, oxynitrides, other suitable high-k dielectric materials, and/or combinations thereof. In the present example, the high-k dielectric layer 230 has a thickness of about 10 Å to about 30 Å.

The capping layer 232 (also referred to as a diffusion layer, a barrier layer, or an etch stop layer (ESL)) includes tantalum nitride. Alternatively, the capping layer 232 could include titanium, titanium nitride, tantalum, tungsten, aluminum, TaCN, TiAlN, TaSiN, WN, other suitable materials, and/or combinations thereof. In the present example, the capping layer 232 has a thickness of about 10 Å to about 200 Å.

The first conductive layer 234 includes aluminum, copper, tungsten, titanium, tantulum, titanium nitride, tantalum nitride, TaC, TaSiN, TaCN, TiAl, TiAlN, WN, metal alloys, doped conducting metal oxides, other suitable materials, and/or combinations thereof. The first conductive layer could be a work function layer. Exemplary work function layers for an NMOS device include tantalum nitride, titanium aluminum, titanium aluminum nitride, or combinations thereof; and exemplary work function layers for a PMOS device include tungsten, titanium nitride, tungsten nitride, or combinations thereof. In the present example, the first conductive layer 234 includes a p-type work function material, such as titanium nitride (TiN), having a thickness of about 10 Å to about 200 Å.

Conventional processing would continue with depositing a conventional hard mask layer, such as spin-on-glass (SOG) or SiOC; patterning the hard mask layer to expose the hard mask layer in the first or second region; performing a combination dry/wet etching process to completely remove the exposed hard mask layer; and replacing the first conductive layer with a second conductive layer. Removing the hard mask layer could include the following sequence: first, a dry etching process removes a portion of the exposed hard mask layer, and then, the exposed hard mask layer is treated with a plasma treatment, such as an $O_2$ plasma treatment, to enhance the etching selectivity of the exposed hard mask layer. The remaining exposed hard mask layer is then removed by a wet etching process, such as a hydrofluoric acid (HF) dipping process. It has been observed that this combination of etching processes can cause damage to the semiconductor device 200. For example, the dry etching process may remove portions of the capping layer (e.g., capping layer 232) that overlie and protect the ILD layer (e.g., ILD layer 226). Consequently, the O₂ plasma treatment can modify the k-value of the ILD layer; and the wet etching process, particularly utilizing an HF solution (or fluoride-based etching solution), undesirably can remove portions of the ILD layer. Additionally, the wet etching process can induce metal residue, which induces leakage in the semiconductor device 200.

Accordingly, the present embodiment provides a hard mask layer having a siloxane polymer base, which will be described in detail below. Utilizing the hard mask layer having the siloxane polymer base can improve gap-filling ability (for example, completely filling in the remainder of the openings in the gate structures 214, 215 without void issues) and/or photoresist adhesion. Further, the hard mask layer having the siloxane polymer base can be substantially removed without performing an O₂ plasma treatment to enhance etching selectivity or performing a fluoride-based wet etching solution (e.g., HF solution). This can prevent high-k dielectric and metal gate damage, prevent modification of the k-value of the ILD layer, and/or prevent ILD loss. Further, the siloxane polymer base has exhibited absorption at wavelengths of 248 nm, 193 nm, and below. Thus, the hard mask layer having the siloxane polymer base can act as an antireflective coating, increasing a lithography depth of focus window and overall patterning. It is understood that different embodiments may have different advantages, and that no particular advantage is necessarily required of any embodiment.

Figure 2D:
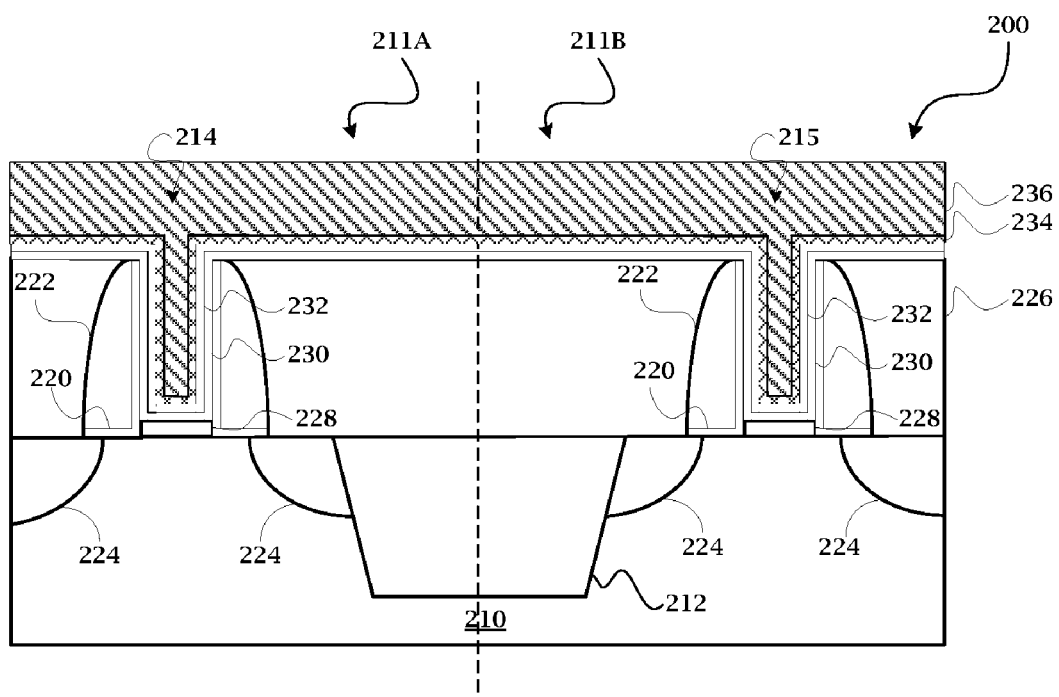

Referring to FIGS. 1 and 2D, at block 108, a hard mask layer 236 having a siloxane polymer base is formed over the substrate 210, wherein the hard mask layer 236 fills the remainder of the openings of gate structures 214, 215. In the present example, the hard mask layer 236 includes a spin-on glass (SOG) material having the siloxane polymer base. Accordingly, the hard mask layer 236 is referred to as a siloxane polymer base SOG or SPS material. Alternatively, the hard mask layer 236 could include fluorinated silica glass (FSG), carbon doped silicon oxide (e.g., SiCOH), Black Diamond® (Applied Materials of Santa Clara, Calif.), Xerogel, Aerogel, amorphous fluorinated carbon, Parylene, BCB (bis-benzocyclobutenes), Flare, SiLK (Dow Chemical, Midland, Mich.), polyimide, TEOS formed oxide, plasma enhanced oxide (PE oxide), high aspect ratio deposition process (HARP) formed oxide, other suitable low-k dielectric materials, and/or combinations thereof. The alternate materials for the hard mask layer 236 also have the siloxane polymer base/functional group. The hard mask layer 236 has a thickness of about 100 Å to about 3,000 Å, and in the present example, the hard mask layer 236 has a thickness of about 1,000 Å to about 2,000 Å. As noted above, the hard mask layer 236 having the siloxane polymer base can provide improved gap filling.

The siloxane polymer includes a ring structure functional group that includes a double bond. The ring structure functional group including a double bond exhibits an increased extinction coefficient, particularly for radiation having wavelengths of 193 nm, 248 nm, and/or 365 nm. For example, the extinction coefficient of the hard mask layer 236 is about 0.1 to about 0.7. In contrast, the extinction coefficient for a conventional SOG material is approximately 0 for wavelengths from about 100 nm to about 700 nm. Accordingly, the hard mask layer 236 can absorb specific wavelengths, acting as an antireflective coating, which can improve photolithography patterning windows.

An exemplary composition for the hard mask layer 236 is:

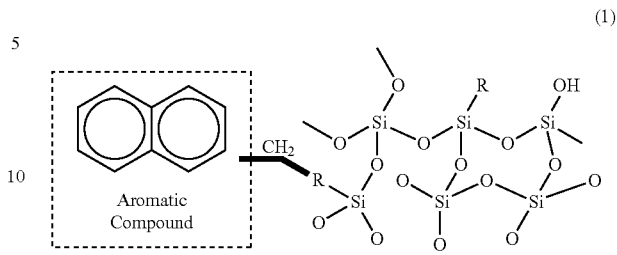

(1)

As illustrated, the hard mask layer 236 has a silicon and oxygen based backbone, such as a backbone found in a conventional SOG material. A functional group, the siloxane polymer, is coupled to the silicon and oxygen based backbone. In the present embodiment, the functional group is an aromatic compound, which has a ring structure including a double bond. Alternatively, the functional group could be a phenanthrene group (2A), a benzene group (2B), a benzocyclobutene group (2C), other suitable functional groups, and/or combinations thereof:

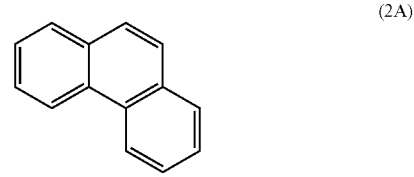

(2A)

(2B)

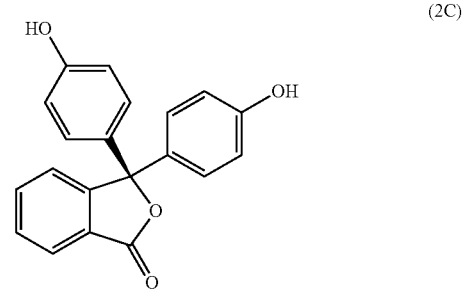

(2C)

With respect to the exemplary composition (1) of the hard mask layer 236, in the present embodiment, R is a methyl group, such as a —CH₃ group. It is understood that other groups are contemplated for R.

Figure 2E:
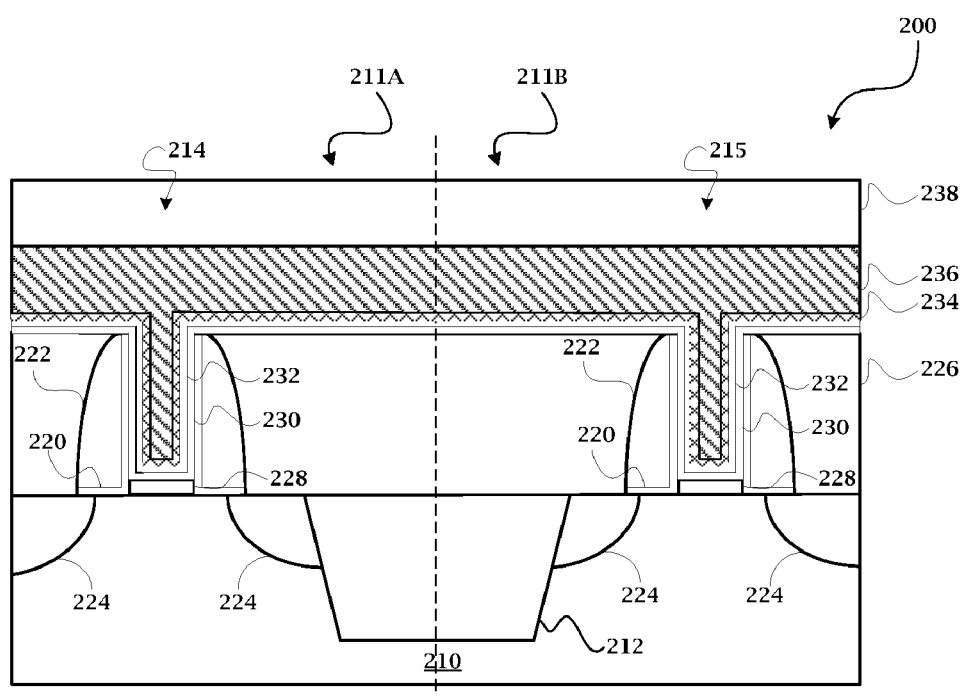
Figure 2F:
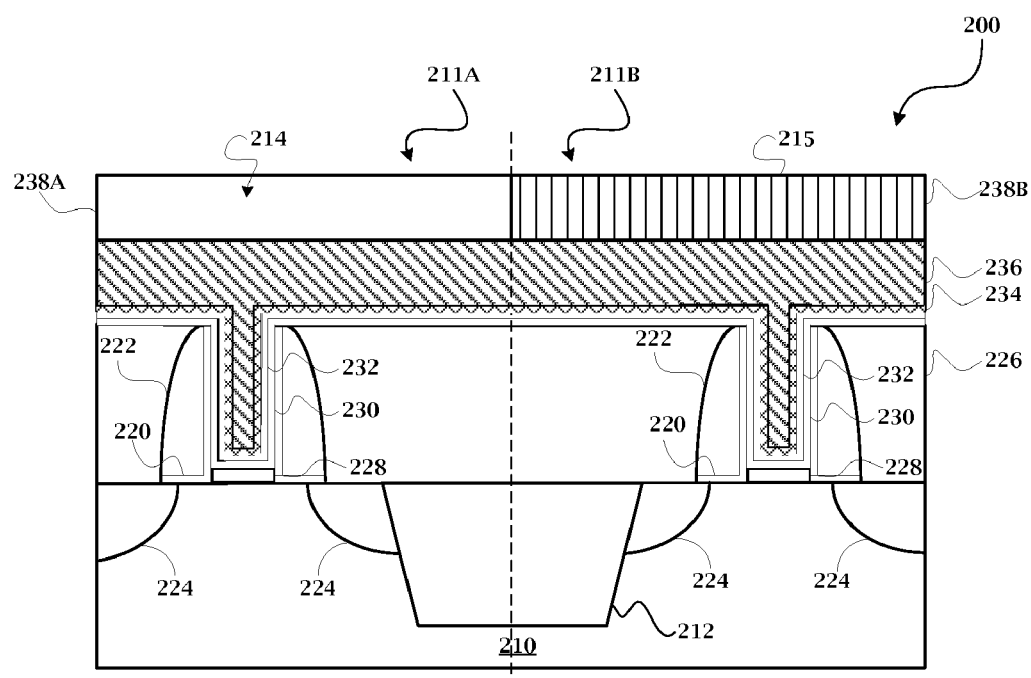
Figure 2G:
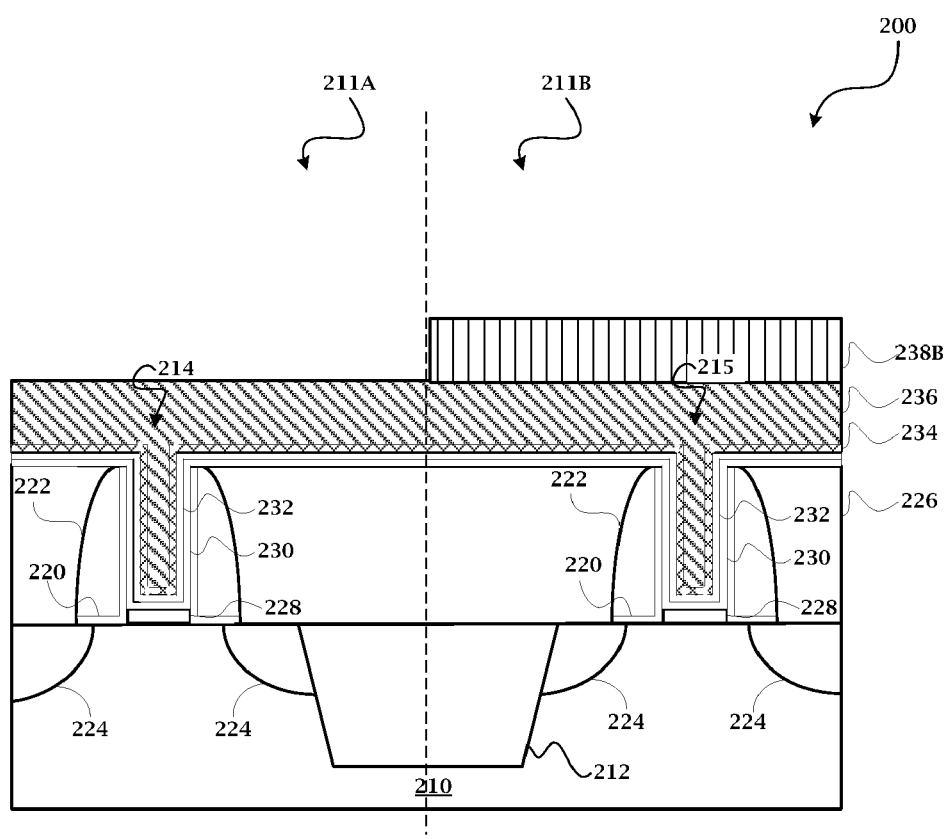

Referring to FIG. 1 and FIGS. 2E-2H, at block 110, the hard mask layer 236 is removed in the first/NMOS region 211A. As illustrated in FIG. 2E, photoresist layer 238 is formed over the hard mask layer 236 (for example, by a spin-on coating process). The photoresist layer 238 is a positive or negative resist material, having a thickness of about 1,000 Å to about 3,000 Å, and in the present example, a thickness of about 2,000 Å. The photoresist layer 238 is patterned to have first portions 238A and second portions 238B (FIG. 2F). In the present example, the second portion 238B provides a protected area of the hard mask layer 236 in the second region 211B (essentially protecting the second/PMOS region 211B and/or hard mask layer 236 in the second region 211B from subsequent processing), and the first portion 238A provides an unprotected area of the hard mask layer 236 in the first region 211A. With reference to FIG. 2G, the first portion 238A is removed (for example, by a developing process) to expose the hard mask layer 236 in the first region 211A (i.e., the unprotected areas of the hard mask layer 236). The present example is merely for illustrative purposes and does not limit the ways in which the photoresist layer 238 could be patterned to expose the hard mask layer 236. Also, additional layers could be formed above or below the photoresist layer 238, such as antireflective coating layers (for example, top antireflective coating (TARC) layers and/or bottom antireflective coating (BARC) layers).

Figure 2H:
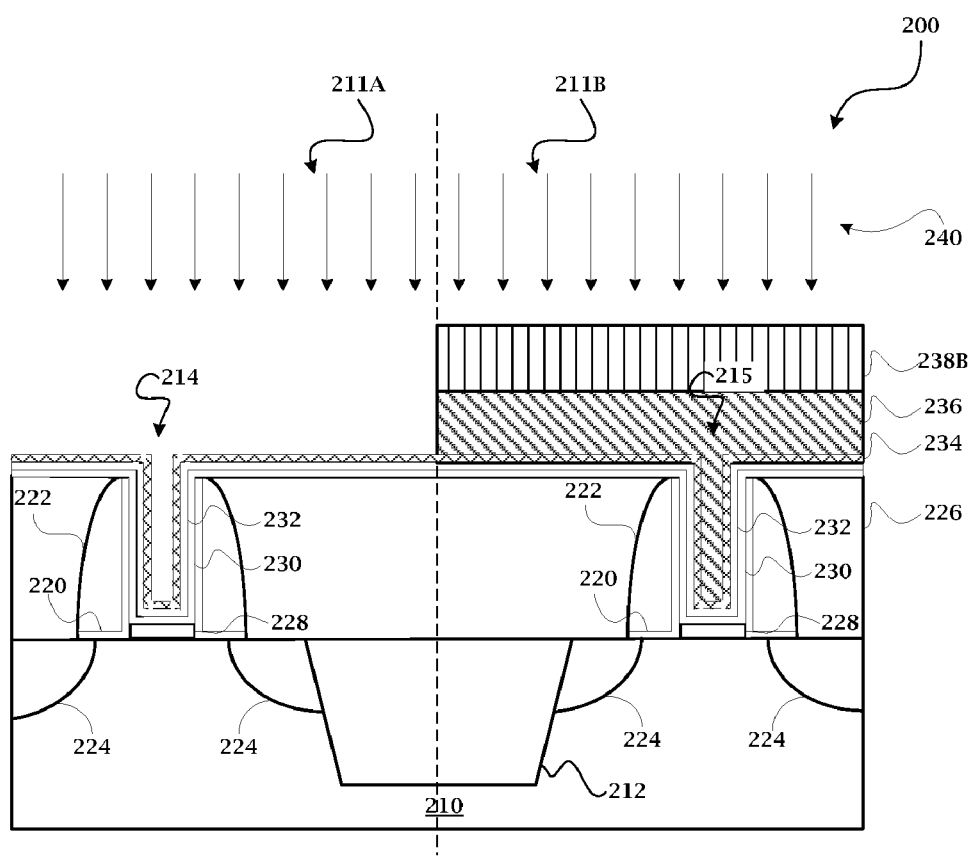
Figure 2I:
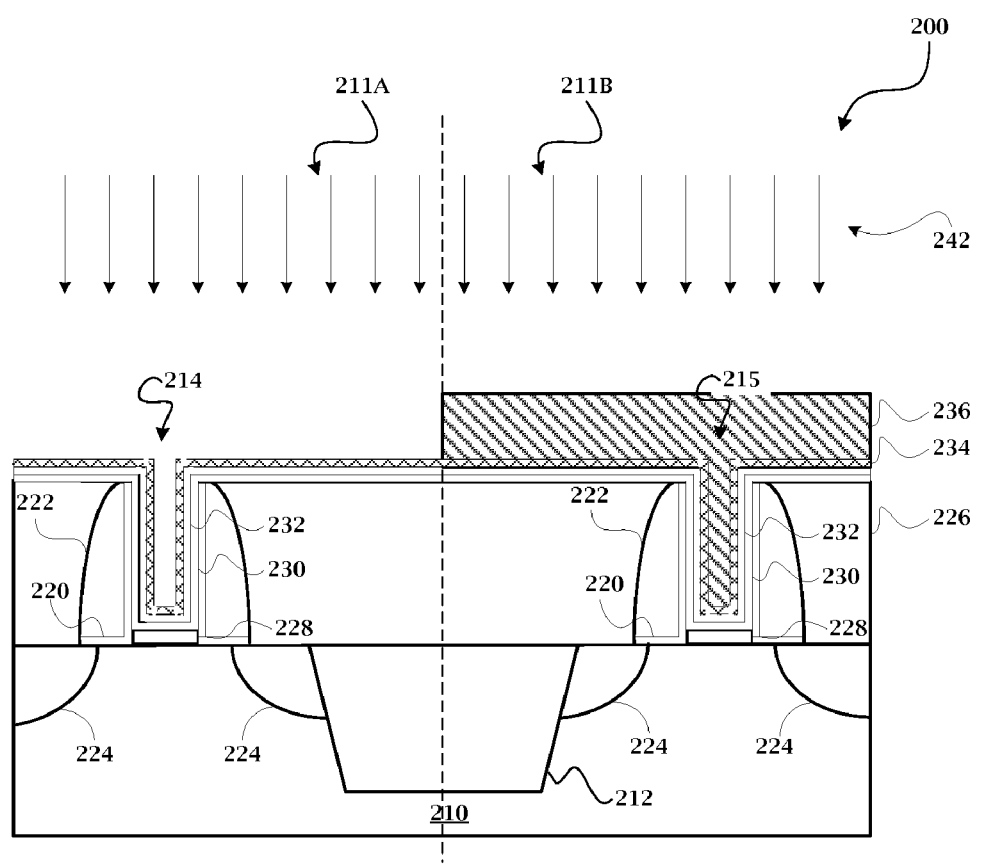

Referring to FIG. 2H, after the photoresist layer 238 is formed and patterned, and a portion of the hard mask layer 236 is exposed (i.e., the hard mask layer 236 in the first/NMOS region 211A), the exposed hard mask layer 236 is removed. In the present embodiment, an etching process 240 removes the exposed hard mask layer 236 in the first/NMOS region 211A, thereby forming another opening in the first gate structure 214. The first etching process 240 is a dry etching process. The dry etching process could be implemented in an etching chamber using process parameters including a radio frequency (RF) or microwave source power, a bias power, a pressure, a flow rate, a wafer temperature, other suitable process parameters, and/or combinations thereof. The dry etching process gas can include an oxygen-containing gas, fluorine-containing gas (e.g., $NF_3$, $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), iodine-containing gas, other suitable gases and/or plasmas, and/or combinations thereof. In the present embodiment, a gas combination of $CF_4/N_2$ is utilized. The dry etching process utilizes a pressure of about 30 mTorr, a power of about 50 W, a $CF_4$ flow rate of about 30 sccm, a $N_2$ flow rate of about 100 sccm, and a process time of about 60 seconds. As noted above, because the hard mask layer 236 includes the siloxane polymer, the dry etching process can remove substantially all the hard mask layer 236. Accordingly, the partial dry etching process, plasma treatment to enhance etching selectivity, and wet etching process (utilizing the fluoride based acid solution) is not necessary to remove the hard mask layer 236. This can prevent reduction of the k-value of the ILD layer 226 and/or prevent undesired loss of the ILD layer 226.

Referring to 2I, an ashing process 242 is then performed to remove the photoresist layer 238 remaining over the hard mask layer 236 (e.g., second portions 238B of the photoresist layer). For example, a nitrogen-containing plasma and/or hydrogen-containing plasma is applied to the substrate 210 to remove (ash) the patterned photoresist layer 238 (i.e., remaining portions 238B). The nitrogen-containing plasma includes nitrogen and may further include hydrogen. In an example, a nitrogen gas ($N_2$) is introduced into a processing chamber to generate nitrogen plasma to ash (or remove) the patterned photoresist layer. The nitrogen gas has any suitable gas flow rate, the processing chamber also being provided at any suitable temperature. In another example, a hydrogen gas ($H_2$) is additionally introduced into the processing chamber to generate a nitrogen/hydrogen containing plasma to remove or ash the patterned photoresist layer. The nitrogen gas and hydrogen gas ratio is properly tuned for effectively removing the patterned photoresist layer. In yet another example, a hydrogen gas ($H_2$) is introduced into a processing chamber to generate hydrogen plasma to ash (or remove) the patterned photoresist layer. The hydrogen gas has any suitable gas flow rate, the processing chamber also being provided at any suitable temperature.

Figure 2J:
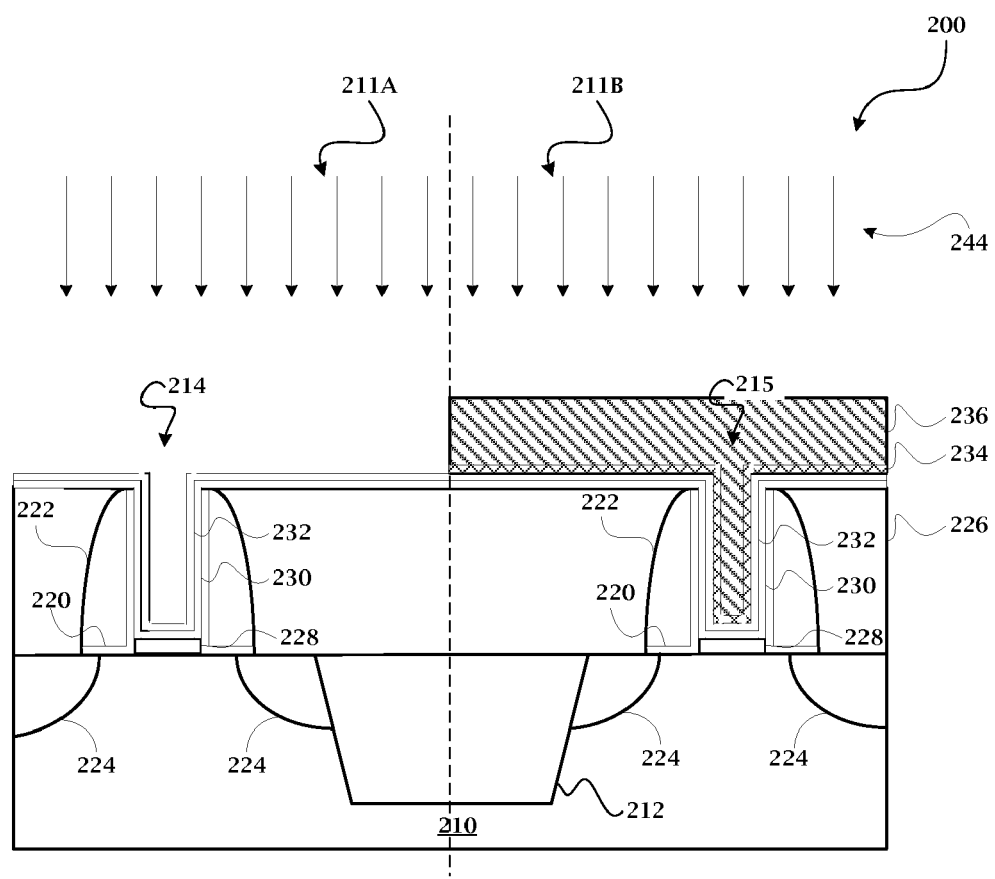
Figure 2K:
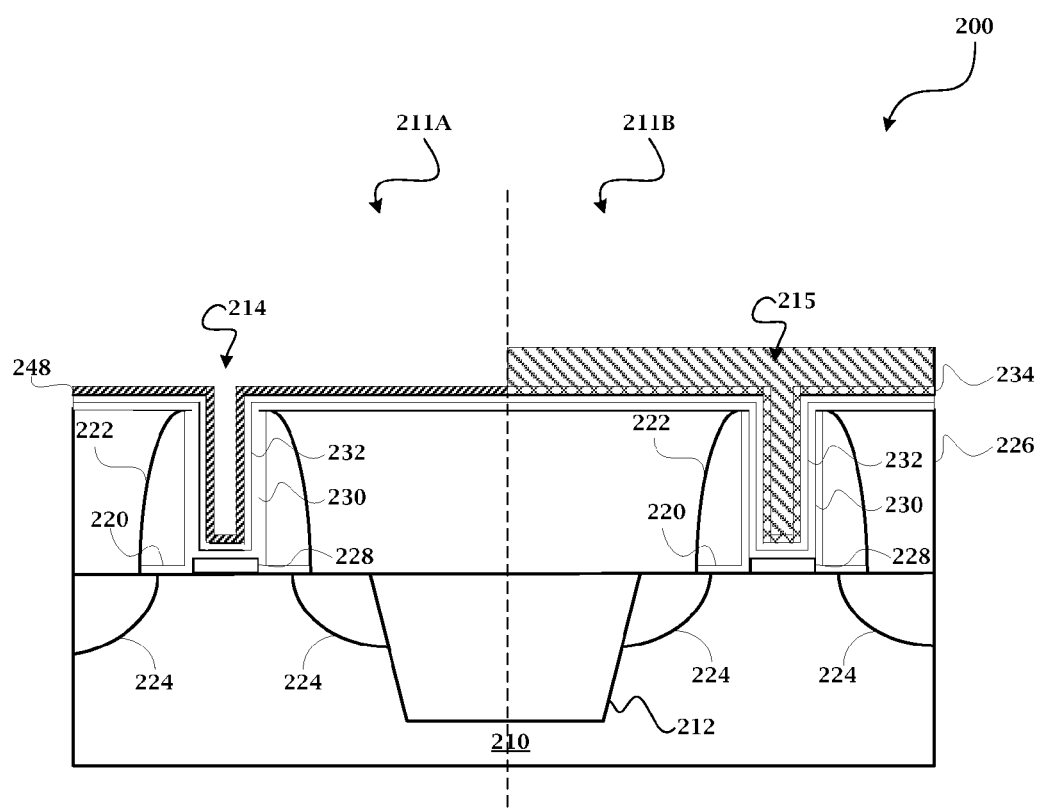

Referring to FIGS. 1 and 2J-2K, at blocks 112 and 114, the first conductive layer 234 is removed from the first region 211A, and a second conductive layer 248 is formed in the first region 211A. With reference to FIG. 2J, the first conductive layer 234 is removed by an etching process 244 from the opening in the first gate structure 214. The etching process 244 is a wet etching process. In the present example, the wet etching process utilizes an ammonia hydroxide-hydrogen peroxide-water mixture ($NH_4OH/H_2O_2/H_2O$ or APM) solution. The APM solution could have a composition ratio ranging from about 1:2:10 to about 1:10:100 of $NH_4OH/H_2O_2/H_2O$. The APM solution could have a temperature ranging between about 20° C. and about 60° C., for example, about 40° C. The semiconductor device 200 is exposed to the APM solution for about 10 seconds to about 600 seconds, for example, about 25 seconds. An exemplary etching process 244 includes subjecting the semiconductor device 200 to an APM solution having a composition ratio of about 1:4:20 of $NH_4OH/H_2O_2/H_2O$ at a temperature of about 40° C. for about 50 seconds. Alternatively, the wet etching solution could include a $NH_4OH$ and $H_2O_2$ solution (SC1), hydrogen peroxide ($H_2O_2$), ozone ($O_3$), sulfuric acid ($H_2SO_4$), phosphoric acid ($H_3PO_4$), acetic acid ($CH_3COOH$), SPM, hydrochloric and hydrogen peroxide mixture (HPM), other suitable solutions, and/or combinations thereof.

With reference to FIG. 2K, the second conductive layer 248 is formed over the capping layer 232 in the first region 211A, partially filling the opening of the gate structure 214. The second conductive layer 248 includes aluminum, copper, tungsten, titanium, tantulum, titanium nitride, tantalum nitride, TaC, TaSiN, TaCN, TiAl, TiAlN, WN, metal alloys, doped conducting metal oxides, other suitable materials, and/or combinations thereof. The second conductive layer could be a work function layer. As noted above, exemplary work function layers for an NMOS device include tantalum nitride, titanium aluminum, titanium aluminum nitride, or combinations thereof; and exemplary work function layers for a PMOS device include tungsten, titanium nitride, tungsten nitride, or combinations thereof. In the present example, the second conductive layer 248 includes an n-type work function material, such as tantalum nitride (TaN), having a thickness from about 10 Å to about 200 Å. Accordingly, the semiconductor device 200 includes the gate structure 214 having an n-type work function in the first/NMOS region 211A and the gate structure 215 having a p-type work function in the second/PMOS region 211B. Alternatively, the first region 211A could be a PMOS region and the second region 211B could be an NMOS region, so the gate structure 214 would include first conductive layer 238 having a p-type work function material, and the gate structure 215 would include an n-type work function material.

Figure 2L:
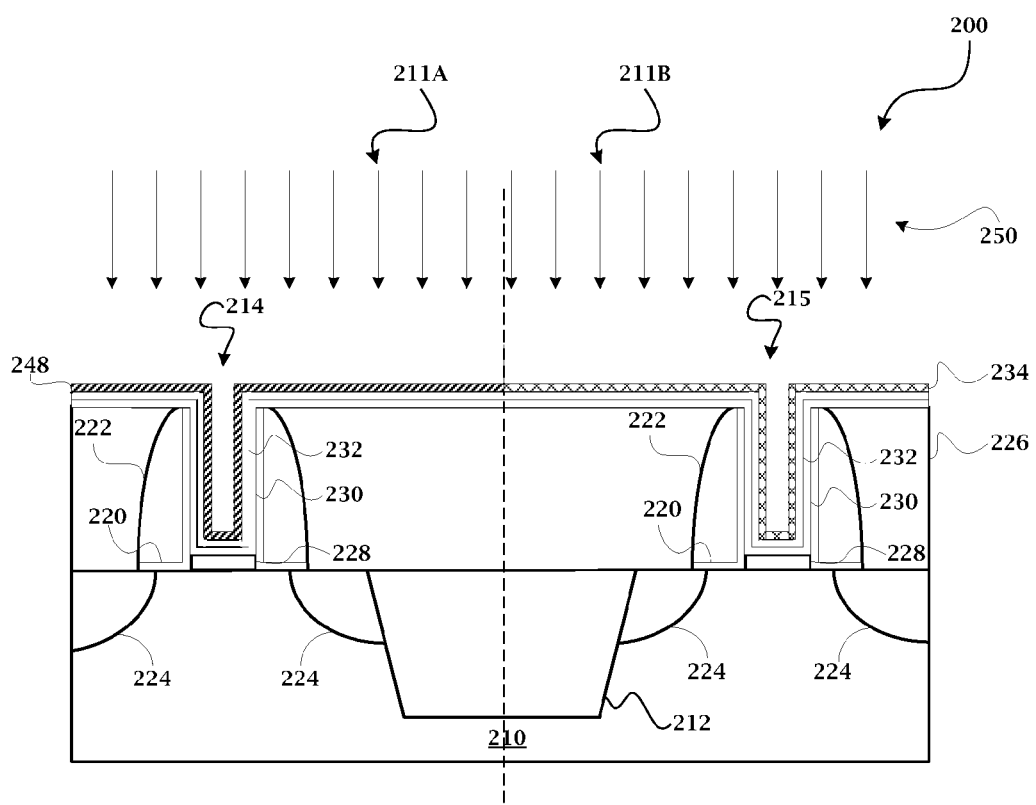
Figure 2M:
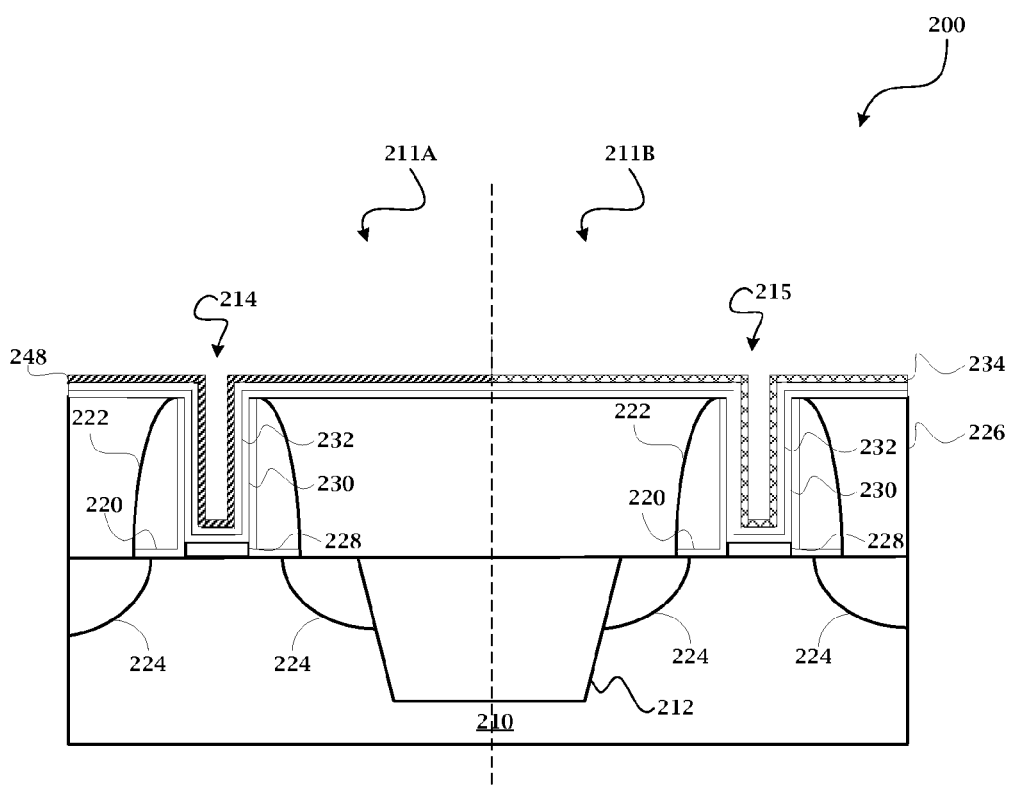

Referring to FIGS. 1 and 2L-2M, at block 116, the hard mask layer 236 is removed from the second region 211B by an etching process 250, thereby substantially removing the hard mask layer 236 from the semiconductor device 200. The etching process 250 utilizes a tetramethyl ammonium hydroxide (TMAH) based solution. Any concentration level of TMAH developer solution may be utilized, such as approximately 2.38% TMAH solution. Alternatively, the etching process 250 could utilize a commercial solution. Exemplary commercial solutions include an ACT® (Ashland Chemical Company of Columbus, Ohio) solution, EKC® (EKC Technology, Inc. of Hayward, Calif.) solution, and/or a CLK® (Mallinckrodt Baker, Inc. of Phillipsburg, N.J.) solution. The semiconductor device 200 can be subjected to the cleaning process 250 for about 10 seconds to about 30 minutes, for example, for about one to two minutes. An exemplary cleaning process 250 includes subjecting the semiconductor device 200 to a CLK-888 solution at a temperature of about 65° C. for about 300 seconds. As noted above, because the hard mask layer 236 includes the siloxane polymer base, the wet etching process 250 can avoid utilizing a fluoride based etching solution, such as an HF solution. Optionally, between removing hard mask layer 236 in the first region 211A and ashing away the photoresist layer 238, the cleaning process similar to cleaning process 250 is performed to remove any polymer residue left by the hard mask layer 236 in the first region 211A.

As noted above, the present embodiment describes a "gate last" process utilizing the hard mask layer having the siloxane polymer. This is intended merely as an example, and it is understood that the hard mask layer having the siloxane polymer can be utilized in any type of gate patterning, or like, process. The semiconductor device 200 can then undergo further CMOS or MOS technology processing to form various features known in the art. For example, bulk metal regions could be formed over the conductive layers 234, 248, completely filling the remaining opening in the gate structures 214, 215. The bulk metal regions could include aluminum deposited by CVD, followed by a CMP. Alternatively, the bulk metal regions could include copper, tungsten, titanium, tantalum, titanium nitride, tantalum nitride, nickel silicide, cobalt silicide; other proper conductive materials; and combinations thereof. The bulk metal regions can also include different materials in each region 211A/211B. Further, subsequent processing may form various contacts/vias and multilayer interconnect features (e.g., metal layers and interlayer dielectrics) on the substrate 210, configured to connect the various features or structures of the semiconductor device 200.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a substrate;
forming a hard mask layer over the substrate;
forming a patterned photoresist layer over the hard mask layer, such that portions of the hard mask layer are exposed;
performing a dry etching process to remove the exposed portions of the hard mask layer;
removing the patterned photoresist layer using at least one of a nitrogen plasma ashing and a hydrogen plasma ashing; and
performing a wet etching process to remove remaining portions of the hard mask layer.

2. The method of claim 1 wherein forming the hard mask layer over the substrate includes forming a hard mask layer including a siloxane polymer.

3. The method of claim 2 wherein forming the hard mask layer including the siloxane polymer includes utilizing a siloxane polymer having a ring structure including a double bond.

4. The method of claim 2 wherein the hard mask layer is a spin-on-glass (SOG) layer.

5. The method of claim 1 wherein performing the wet etching process includes utilizing a tetramethyl ammonium hydroxide (TMAH) based solution, an ACT based solution, an EKC based solution, or CLK based solution.

6. The method of claim 1 further comprising:
forming a material layer between the hard mask layer and the substrate; and
after removing the exposed portions of the hard mask layer, performing a wet etching process to remove exposed portions of the material layer.

7. The method of claim 6 wherein performing the wet etching process includes utilizing an ammonia/hydrogen peroxide mix (APM) solution.

8. A method comprising:
providing a substrate having a first region that includes a gate structure and a second region that includes a gate structure, wherein a high-k dielectric layer and a first conductive layer partially fill in openings of the gate structures;
forming a hard mask layer including a siloxane polymer base over the substrate, wherein the hard mask layer fills the remainder of the openings in the gate structures;
forming a patterned photoresist layer over the hard mask layer, such that the hard mask layer in the first region is exposed;
performing a dry etching process to remove the exposed hard mask layer in the first region;
performing an ashing process to remove the patterned photoresist layer;
performing a wet etching process to remove the first conductive layer from the gate structure in the first region; and
performing another wet etching process to remove the hard mask layer in the second region.

9. The method of claim 8 wherein performing the ashing process includes utilizing a nitrogen plasma, a hydrogen plasma, or combination thereof.

10. The method of claim 8 wherein performing the wet etching process to remove the first conductive layer from the gate structure in the first region includes utilizing an ammonia/hydrogen peroxide mix (APM) solution.

11. The method of claim 8 wherein performing the another wet etching process to remove the hard mask layer in the second region includes utilizing a tetramethyl ammonium hydroxide (TMAH) based solution.

12. The method of claim 8 further comprising forming a second conductive layer for the gate structure in the first region.

13. The method of claim 12 wherein forming the first conductive layer includes forming a p-type work function metal layer and forming the second conductive layer includes forming an n-type work function metal layer, such that the gate structure in the first region is a PMOS device and the gate structure in the second region is an NMOS device.

14. The method of claim 12 wherein forming the first conductive layer includes forming an n-type work function metal layer and forming the second conductive layer includes forming a p-type work function metal layer, such that the gate structure in the first region is an NMOS device and the gate structure in the second region is a PMOS device.

15. A method for fabricating an integrated circuit comprising:
- providing a substrate with a first region and a second region;
- forming a first gate structure in the first region and a second gate structure in the second region, wherein the first and second gate structures include a dummy gate;
- removing the dummy gate from the first and second gate structures, thereby forming an opening in the first and second gate structures;
- forming a high-k dielectric layer, a capping layer, and a first conductive layer to partially in the opening of the first and second gate structures;
- forming a hard mask layer including a siloxane polymer over the substrate, wherein the hard mask layer fills the remainder of the opening of the first and second gate structures;
- forming a patterned photoresist layer over the hard mask layer, such that the patterned photoresist layer exposes the hard mask layer in the first region;
- performing a dry etching process to remove the hard mask layer in the first region, including removing the hard mask layer from the first gate structure, thereby forming another opening in the first gate structure such that the first conductive layer is exposed;
- performing an ashing process to remove the patterned photoresist layer, wherein the ashing process includes utilizing a nitrogen plasma, a hydrogen plasma, or combination thereof;
- performing a wet etching process to remove the exposed first conductive layer in the another opening of the first gate structure;
- forming a second conductive layer to partially fill in the another opening of the first gate structure in the first region; and
- performing another wet etching process to remove the hard mask layer in the second region.

16. The method of claim 15 wherein forming the hard mask layer including the siloxane polymer includes forming a spin-on-glass (SOG) layer having a ring functional group including a double bond.

17. The method of claim 16 wherein forming the spin-on-glass material having a ring functional group includes utilizing an aromatic compound for the ring functional group.

18. The method of claim 15 wherein performing the wet etching process includes utilizing an ammonia/hydrogen peroxide mix (APM) solution.

19. The method of claim 15 wherein performing the another wet etching process includes utilizing a fluoride-free wet etching solution.

20. The method of claim 19 wherein utilizing the fluoride-free wet etching solution includes utilizing a tetramethyl ammonium hydroxide (TMAH) based solution, an ACT based solution, an EKC based solution, or a CLK based solution.

* * * * *